United States Patent
Fürsich et al.

(10) Patent No.: US 7,903,429 B2
(45) Date of Patent: Mar. 8, 2011

(54) HOUSING FOR RECEIVING PRINTED CIRCUIT BOARDS WHOSE COMPONENTS FORM AT LEAST PARTS OF A COMMUNICATION SYSTEM

(75) Inventors: Walter Fürsich, Dortmund (DE); Friedhelm Harnischmacher, Waltrop (DE); Markus Verding, Essen (DE)

(73) Assignee: Siemens Aktiengesellschaft, Munich (DE)

( * ) Notice: Subject to any disclaimer, the term of this patent is extended or adjusted under 35 U.S.C. 154(b) by 225 days.

(21) Appl. No.: 10/567,618

(22) PCT Filed: Jun. 7, 2004

(86) PCT No.: PCT/EP2004/006103
§ 371 (c)(1),
(2), (4) Date: May 13, 2008

(87) PCT Pub. No.: WO2005/025245
PCT Pub. Date: Mar. 17, 2005

(65) Prior Publication Data
US 2008/0205006 A1 Aug. 28, 2008

(30) Foreign Application Priority Data
Aug. 8, 2003 (DE) .................................. 103 36 610

(51) Int. Cl.
*H05K 7/18* (2006.01)
*H05K 1/11* (2006.01)
*H05K 7/00* (2006.01)
*H01R 13/64* (2006.01)
*H04M 7/00* (2006.01)

(52) U.S. Cl. ......... 361/802; 361/801; 361/796; 361/752; 361/748; 439/377; 379/330; 312/223.2

(58) Field of Classification Search .................. 361/726, 361/802, 801, 796, 784, 748, 752; 439/377; 379/330; 312/223.2
See application file for complete search history.

(56) References Cited

U.S. PATENT DOCUMENTS

| 3,684,925 | A | * | 8/1972 | Naff, Jr. ........................ 361/688 |
| 4,213,013 | A | * | 7/1980 | Perna et al. .................... 379/383 |
| 4,303,296 | A | * | 12/1981 | Spaulding ...................... 439/189 |
| 4,716,499 | A | * | 12/1987 | Bhargava ....................... 361/740 |
| 4,749,359 | A | * | 6/1988 | White ............................ 439/133 |
| 4,821,150 | A | * | 4/1989 | Duthie et al. .................. 361/736 |
| 4,827,504 | A | * | 5/1989 | Collins et al. ............. 379/413.02 |
| 4,910,770 | A | * | 3/1990 | Collins et al. ............. 379/413.02 |
| 4,945,559 | A | * | 7/1990 | Collins et al. ............. 379/413.02 |

(Continued)

FOREIGN PATENT DOCUMENTS
DE 43 42 739 A1 6/1995
(Continued)

*Primary Examiner* — Jayprakash N Gandhi
*Assistant Examiner* — Bradley H Thomas

(57) ABSTRACT

A housing for receiving printed circuit boards whose components form at least parts of a communication system, comprising a housing cover and a connection area which is accessible from the outside. A main printed circuit board is arranged between the base housing part and a cover part. Plug-in devices for at least one extension printed circuit board are provided in an extension area of the main printed circuit board. A first hood is provided in order to cover the extension area. The hood has push-through openings arranged towards the connection area, corresponding to plug-in devices on at least one extension printed circuit board in an assembled state. The first hood can engage with the cover part by means of a lock connection whereby said lock connection can only be released using a tool.

18 Claims, 6 Drawing Sheets

U.S. PATENT DOCUMENTS

| | | | |
|---|---|---|---|
| 5,130,893 A * | 7/1992 | Straate et al. | 361/728 |
| 5,398,156 A * | 3/1995 | Steffes et al. | 361/679.58 |
| 5,521,793 A * | 5/1996 | Dalgleish et al. | 361/752 |
| 5,528,684 A * | 6/1996 | Schneider et al. | 379/413.03 |
| 5,552,965 A * | 9/1996 | Habegger | 361/801 |
| 5,568,355 A * | 10/1996 | Verding et al. | 361/676 |
| 5,633,926 A * | 5/1997 | Cannetti | 379/440 |
| 5,671,126 A * | 9/1997 | Verding et al. | 361/796 |
| 5,803,292 A * | 9/1998 | Daoud | 220/4.02 |
| 5,832,078 A * | 11/1998 | Tuvy et al. | 379/413.04 |
| 5,901,220 A * | 5/1999 | Garver et al. | 379/399.01 |
| 5,982,619 A * | 11/1999 | Giannatto et al. | 361/701 |
| 6,011,831 A * | 1/2000 | Nieves et al. | 379/21 |
| 6,026,160 A * | 2/2000 | Staber et al. | 379/413.03 |
| 6,078,661 A * | 6/2000 | Arnett et al. | 379/413.04 |
| 6,157,714 A * | 12/2000 | Daoud | 379/413.02 |
| 6,159,022 A * | 12/2000 | Tsai | 439/76.1 |
| 6,219,252 B1 * | 4/2001 | Tsai | 361/752 |
| 6,229,890 B1 * | 5/2001 | Kerr et al. | 379/413.02 |
| 6,292,558 B1 * | 9/2001 | Smith | 379/399.01 |
| 6,307,933 B1 * | 10/2001 | Stehlin et al. | 379/413.03 |
| 6,319,018 B1 * | 11/2001 | Daoud | 439/65 |
| 6,322,375 B1 * | 11/2001 | Cole et al. | 439/76.1 |
| 6,488,542 B2 * | 12/2002 | Laity | 439/676 |
| 6,688,919 B2 * | 2/2004 | Sumer et al. | 439/718 |
| 6,714,647 B1 * | 3/2004 | Cowan et al. | 379/413.02 |
| 6,830,458 B2 * | 12/2004 | Kobayashi et al. | 439/59 |
| 6,848,946 B2 * | 2/2005 | Vicenza et al. | 439/620.29 |
| 2001/0021103 A1 * | 9/2001 | Takagi | 361/752 |
| 2002/0050771 A1 * | 5/2002 | Krispin et al. | 312/223.2 |
| 2003/0073338 A1 * | 4/2003 | Sumer et al. | 439/368 |
| 2003/0218867 A1 * | 11/2003 | Sawyer et al. | 361/721 |

FOREIGN PATENT DOCUMENTS

| | | |
|---|---|---|
| EP | 0 964 586 A2 | 12/1999 |
| JP | 08032267 A | 2/1996 |
| JP | 2000114739 A | 4/2000 |
| JP | 2002043765 A | 2/2002 |

* cited by examiner

HOUSING FOR RECEIVING PRINTED CIRCUIT BOARDS WHOSE COMPONENTS FORM AT LEAST PARTS OF A COMMUNICATION SYSTEM

CROSS REFERENCE TO RELATED APPLICATIONS

This application is the US National Stage of International Application No. PCT/EP2004/006103, filed Jun. 7, 2004 and claims the benefit thereof. The International Application claims the benefits of German application No. 10336610.5 DE filed Aug. 8, 2003, both of the applications are incorporated by reference herein in their entirety.

FIELD OF INVENTION

The invention relates to a housing for receiving printed circuit boards whose components form at least parts of a communication system, with a housing cover and a connection area accessible from the outside, with a main printed circuit board being arranged between a base housing part and a cover part and plug-in devices being provided in an expansion area of the main printed circuit board for at least one extension circuit board.

BACKGROUND OF INVENTION

Housings for receiving printed circuit boards equipped with components are known in various embodiments. With a housing which is used for termination units of a communication system there is frequently the demand for the basic structural design to be able to be expanded for different terminals. A telecommunications device can for example be arranged in its basic design for two S0 exchange ports and four analog subscriber lines. In an expanded capacity stage the system should be able to be expanded for further system terminations. The housing is expanded by fitting additional analog and/or digital subscriber interfaces in the form of extension cards which are connected by means of plug-in devices to the main printed circuit board of the communication system. This means that space must be provided within the housing for these extension cards which must be accessible to authorized persons but not accessible to the user. On the other hand a connection area must be provided in the housing which is easy to open for the user, to enable his subscriber termination units to be connected to the communication system.

Termination units of a telecommunications system are manufactured in high volumes and the housing must be as simple and as cheap as possible to manufacture.

SUMMARY OF INVENTION

An underlying object of the invention is to specify a housing of this type so that it is cheaper to manufacture and is designed so that the space for fitting extension components is exclusively accessible to authorized persons, whereas for adding system termination units, it is a simple matter to access a connection area.

This object is achieved by the features of the independent claim. Advantageous embodiments, aspects and details of the invention are produced by the independent claims, the description and the enclosed drawings.

In accordance with the invention, with a housing of the type mentioned at the start, the extension area is covered by a first hood which locks onto the base part with a tool being required to release the lock connection. Access to the extension area is thus restricted to persons with authorization to perform service or maintenance work. Push-through openings are provided in a wall of the first hood adjoining the connection area. In an assembled state these push through openings correspond with plug-in devices on extension printed circuit boards which are plugged into the extension area on the main printed circuit board. This makes is possible to connect system terminations from the outside.

A preferred version of the housing is one in which, to cover the connection area, a second hood is provided, which can be attached to the base housing part by means of a releasable snap-in connection. No tool is required to release the snap-in connection. The second hood can easily be removed by hand from the base housing part.

It is useful for the base housing part to feature supports extending to the main printed circuit board. This construction simply holds the main printed circuit board by clamping it between the supports and the lowered hood part.

In an especially preferred embodiment plug-in devices are provided on the end face of the main printed circuit board, by means of which an electrical connection can be established with at least one second extension printed circuit board. This second extension printed circuit board also features plug-in devices which are accessible from the connection area. This enables the subscriber line interfaces to be expanded in a simple manner.

Advantageously push-through openings are arranged in a wall section of the first hood towards the connection area which are provided with a starting bevel. The starting bevel makes it easier to put the first hood on and the gap to the connector of an extension printed circuit board can be dimensioned to be narrower.

As regards the cost of manufacturing it is especially useful for the cover part, the first and/or second cover to be manufactured by moulding, preferably from a plastic.

An attractive form of the housing is characterized by the fact that the first and the second hood form a convex curve in a central area running concentrically to the longitudinal center axis.

In this case it is preferable that in the assembled state, the first hood and the second hood adjoin the side wall sections of the cover part to form a continuous surface.

BRIEF DESCRIPTION OF THE DRAWINGS

The invention will now be explained in greater detail on the basis of a preferred exemplary embodiment with reference to the enclosed drawings. The figures show.

DETAILED DESCRIPTION OF INVENTION

Figure 1:
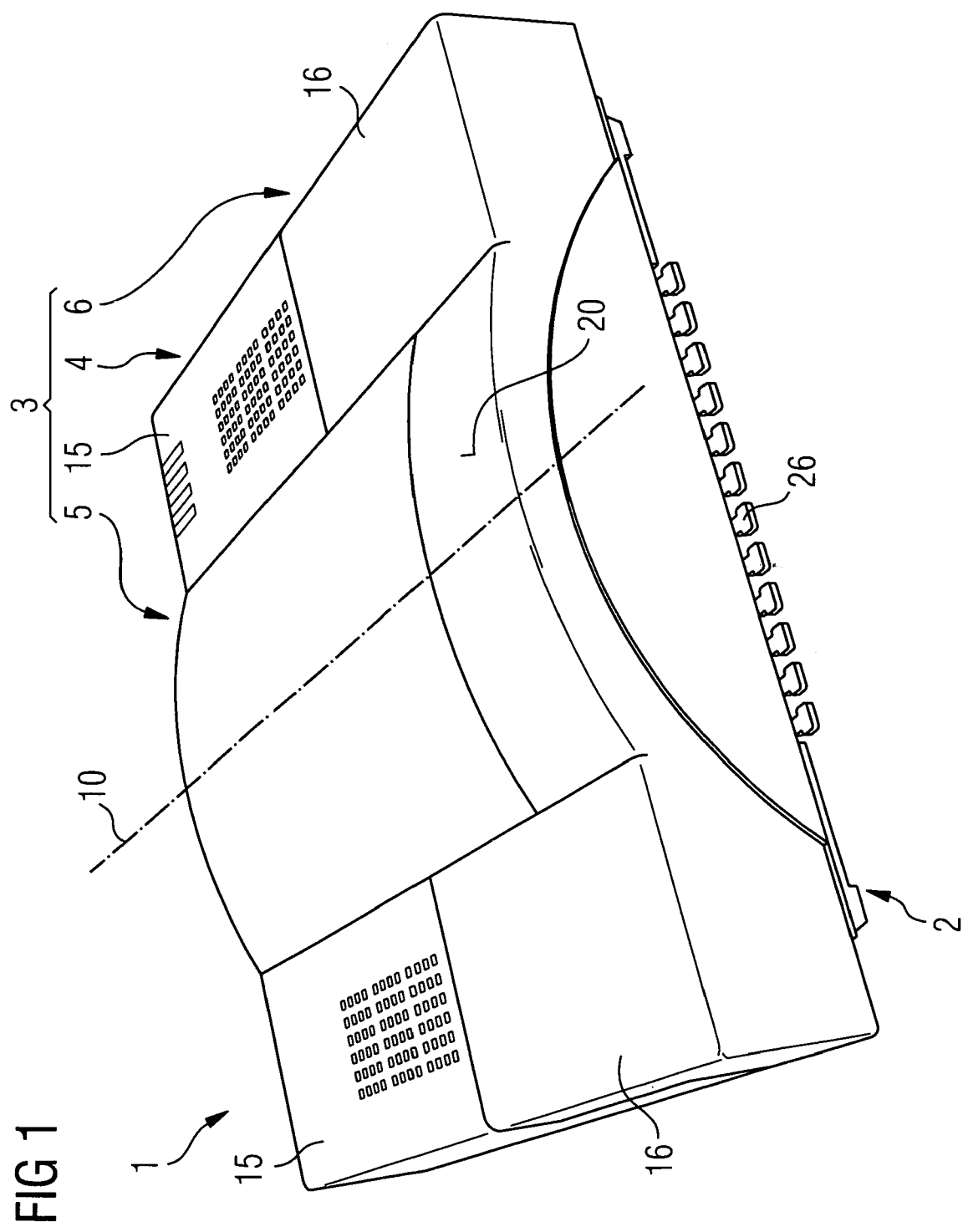
FIG. 1 the housing in accordance with the invention in an assembled state in a perspective view.

FIG. 1 shows the inventive housing 1 in an assembled state. The housing contains electronic components of a telecommunications system. It essentially consists of a base housing part 2 and a housing cover 3. The housing cover 3 consists of a cover 4, a first hood 5 and a second hood 6. In its assembled state the housing 1 is essentially rectangular in shape. The cover 4 and the two hoods 5 and 6 are grouped symmetrically around the longitudinal center axis 10. As can be easily seen from the perspective view, the housing 1 features a convex curved front center surface 20 running concentrically to the longitudinal center axis 10. The sides of the front center surface 20 are adjoined by the wall sections 15 of the cover part 4 and wall sections 16 of the second hood 6. The front center surface 20 forming a forwards-facing convex curve forms a continuous transition surface to the front surfaces of the side wall sections 15 and 16, which gives the housing 1 an attractive exterior form.

Figure 2:
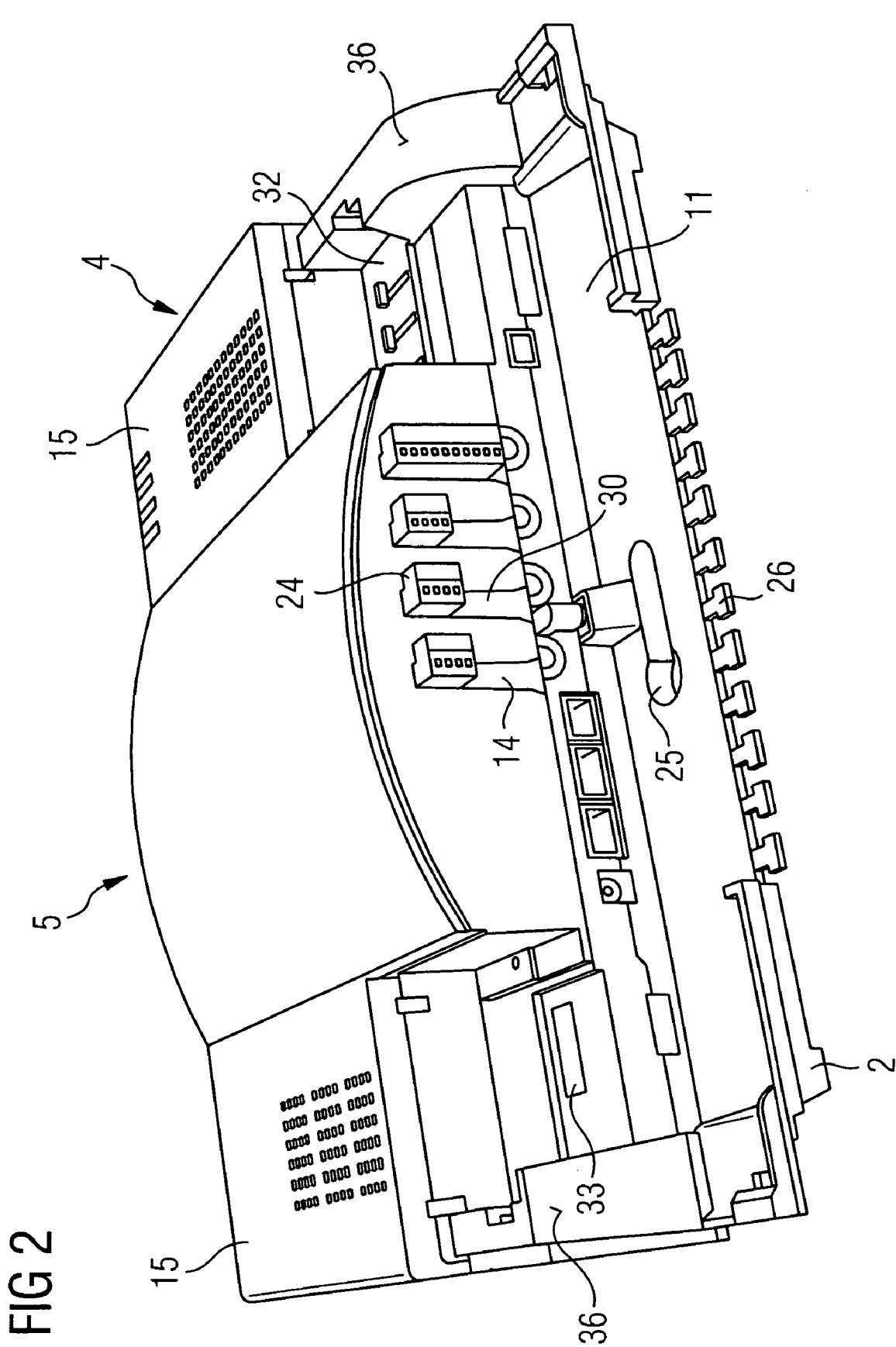
FIG. 2 the inventive housing of FIG. 1, with the second cover removed and the connection area visible FIG. 3 the inventive housing of FIG. 2 in which the first hood is shown in a raised position.

FIG. 2 shows the inventive housing 1 in a view in which the second hood 6 is removed, which allows the connection area 11 to be seen. The connection area 11 lies in a profiled recess extending backwards from the front side of the housing. In the connection area 11 different plug-in devices 24, 32, 33 for electrical connection of system terminations can be seen.

Figure 3:
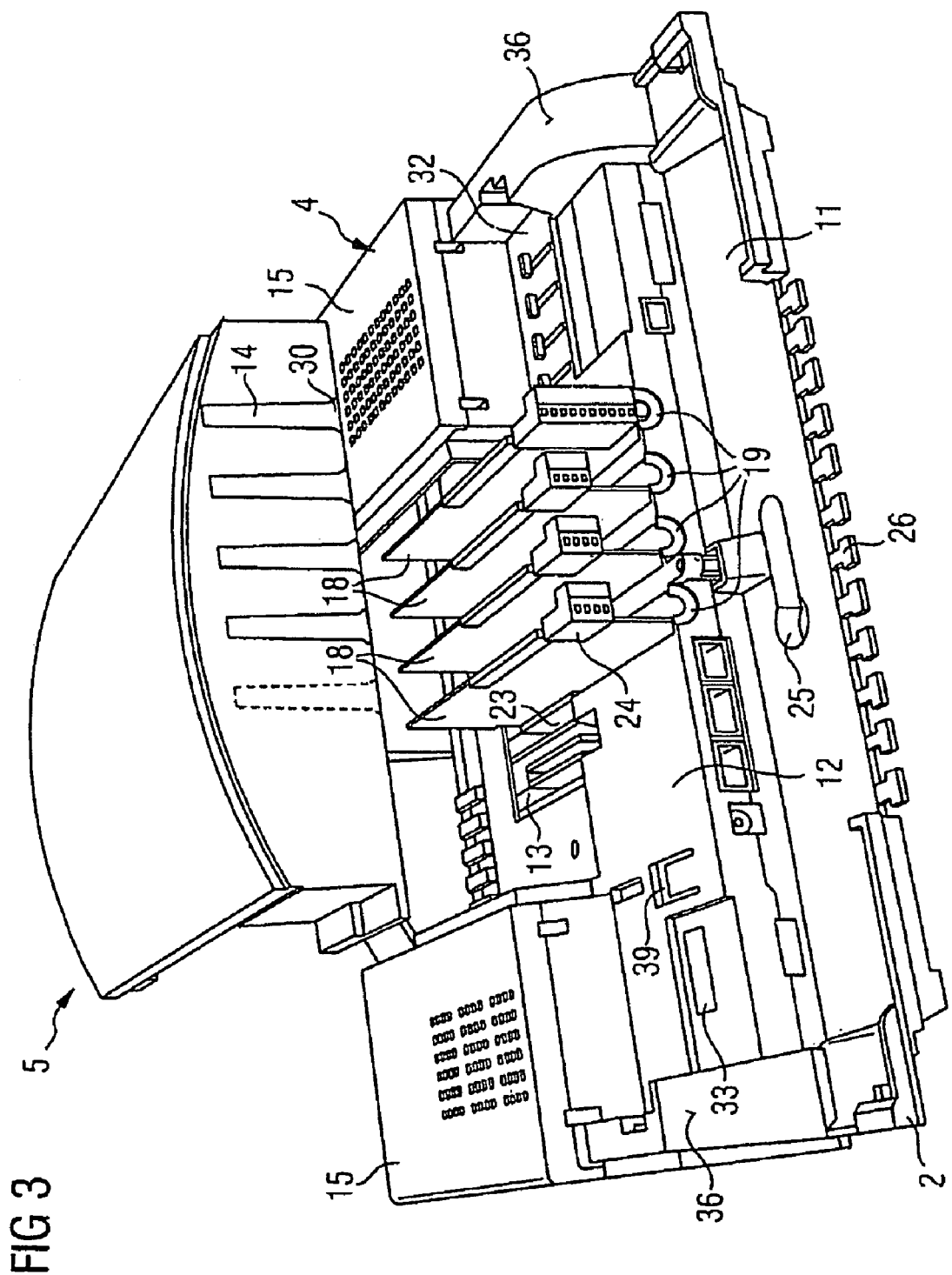

The view shown in FIG. 3 differs from that shown in FIG. 2 in that the first hood 5 is shown in a raised position. This reveals the extension area 12 with the extension printed circuit board 18. The recess of the cover part 4 continues into the extension area 12 and is broken through by plug-in openings 13. The plug-in openings 13 allow plug-in devices 23 to be seen which are accommodated on the main printed circuit board 8. Extension circuit boards 18 are plugged into the plug-in devices 23; The drawing of FIG. 3 for example shows four plugged-in extension circuit boards 18. The extension circuit boards 18 are held on one of their bottom edges in guides 19 of the cover part 4. Each extension circuit board 18 features plug-in devices 24 on a side facing towards the connection area 11. The plug-in devices 24 are intended for the connection of user-side terminations and are accessible from the connection area 11.

Figure 4:
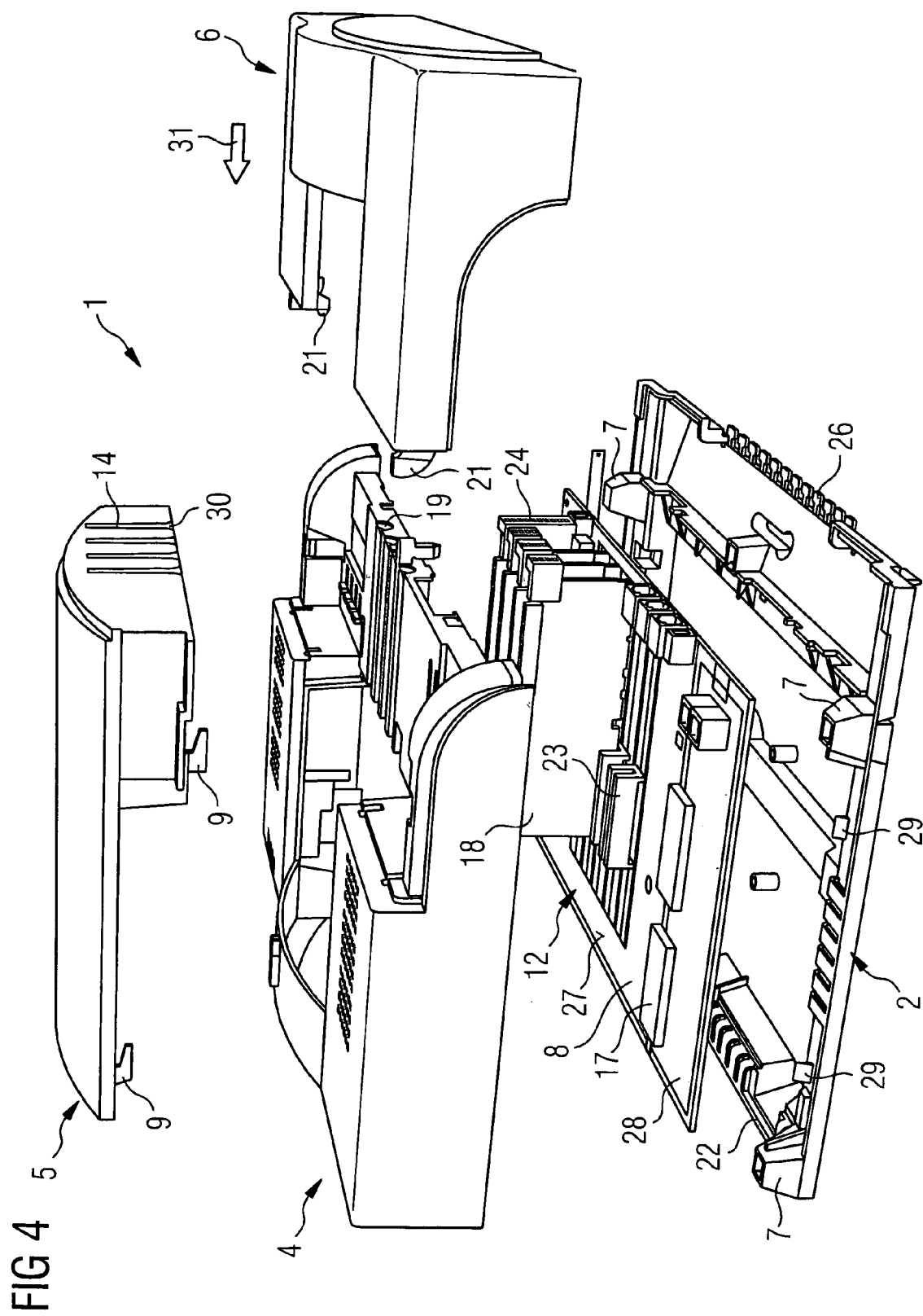
FIG. 4 the inventive housing of FIG. 1 in an exploded view.

FIG. 4 shows an exploded view of the inventive housing 1. The communication system is now assembled so that the main printed circuit board 8 is placed on a surrounding support edge 22 of the base housing part 2 and the cover part 4 is placed on it (the guides 7 are used to guide the circuit board and the cover part 4 on assembly). When the cover part 4 is lowered, the locking clips 29 are deflected by the base part 2. In a lowered position of the cover part 4 the locking clips 29 engage in corresponding locking tabs of the cover 4. In the locked state the main printed circuit board 8 is clamped between the base housing part 2 and the cover part 4. The sequence then continues with the first hood 5 being put on, the attachment tabs 9 being inserted and connected by means of the connection 39 (FIG. 3) to the cover part 4. The clip connection 39 can be released again by the maintenance personnel of the communication system using a tool such as a screwdriver A as may be seen in FIG. 6. However the mounting area 12 (FIG. 3) of the extension circuit board 18 remains inaccessible for the user. After the first hood 5 has been fitted, the second hood 6 is installed in a last step of assembly. This involves pushing the hood 6 onto the connection area in the direction of the arrow 31 and latching it by means snap-in hook 37 (FIG. 5) to cover part 4. This is done by turning it counterclockwise and does not require a mechanical tool. The twist locks 21 assists in latching in the hood 6. This construction allows the second hood 6 to be easily removed manually and makes the connection area easily accessible from the user side.

The rear wall of the base housing part 2 features cutouts 26 in its edge area to which the incoming and outgoing lines can be attached, by cable ties for example. The keyhole-shaped slot 25 is used for wall mounting of the housing 1. To cover plug-in locations which are not being used, break-out parts are provided which can be broken out from the opening depending on the capacity stage. The exemplary embodiment shown has four mounting locations for sub-modules, each of which has an accessible interface area available. The fifth mounting location is used to accept shorter modules with no interface to the outside.

As the exploded diagram of FIG. 4 shows, plug-in devices 17 are provided on the face of the main printed circuit board 8 by means of which the main printed circuit board 8 is electrically connected to further extension circuit boards 28. The sides of these extension circuit boards 28 are plugged into the main printed circuit board 8 and they run essentially in the plane of the main printed circuit board surface 27. This enables an analog subscriber line interface 32 to be expanded in an expanded capacity stage into a digital subscriber interface 33 (FIG. 2).

Figure 5:
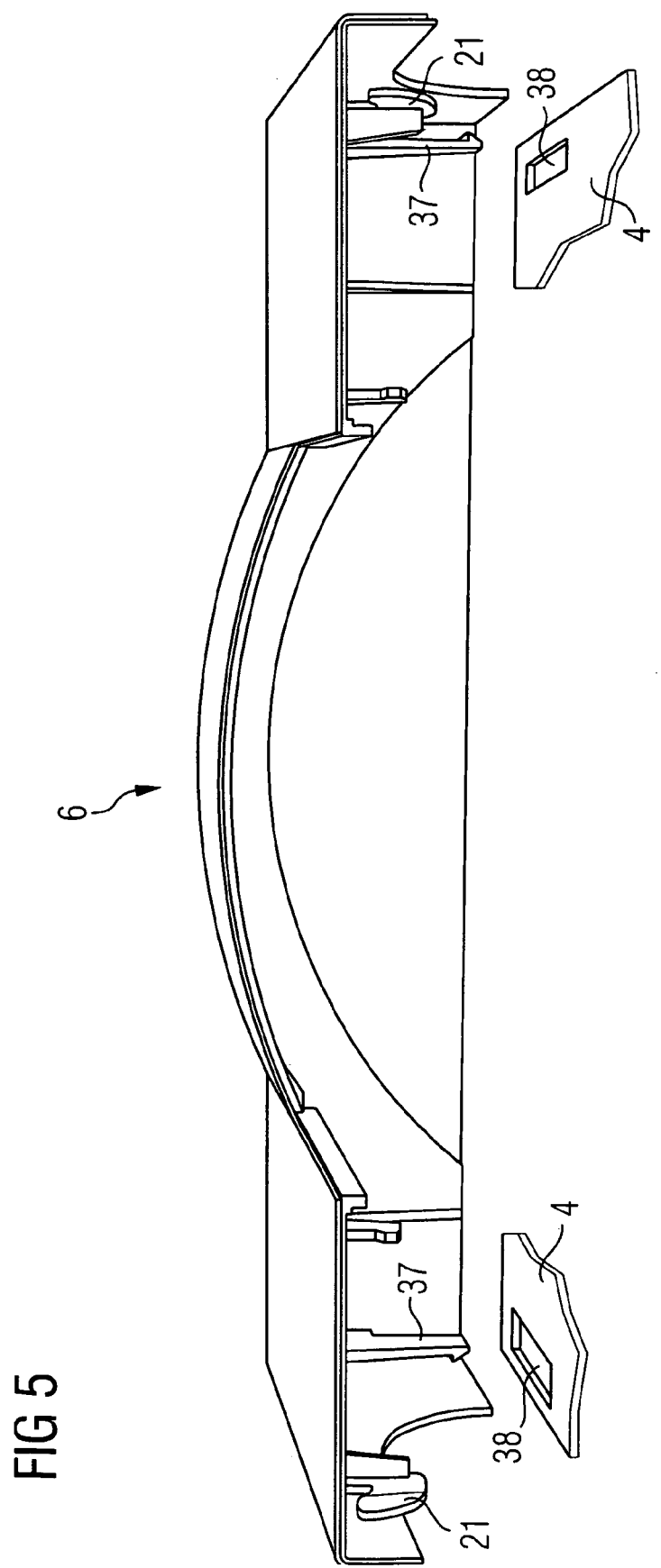
FIG. 5 the first hood seen from the inside.
Figure 6:
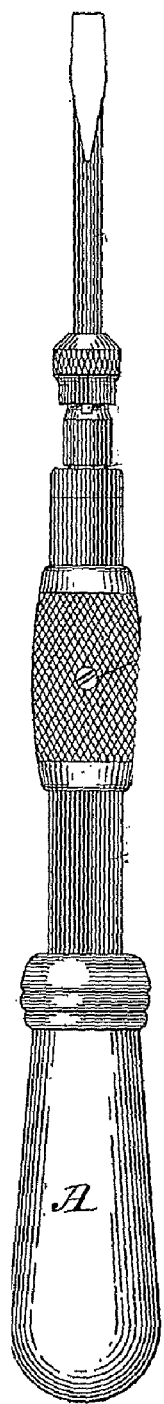
FIG. 6 is a perspective view of an embodiment of a mechanical tool, which is illustrated as a screwdriver.

FIG. 5 shows the second hood 6 viewed from the direction of the connection area. When the hood 6 is put on the twist locks 21 are introduced into the corresponding cutouts in the first hood 5. As the hood 6 is lowered, the snap hooks 37 latch into corresponding cutouts 38 of the cover part 4. These snap-in connections are released from outside by applying force to the side walls of the second hood 6 and do not require a tool to be used.

As can be seen from the above embodiment, the inventive housing essentially consists of four parts which are assembled using latches or snap-in hooks into a construction. The assembly is simple and possible in a comparatively short time. Expensive means of connection, such as screws for example, are not required. As regards the costs of manufacturing, a design of the housing made from plastic is very good. All parts of the housing cover 3, as well as the base housing part, can be manufactured at low cost using injection molding.

Naturally the invention is not restricted to use in a telecommunications system but can also be used for similar tasks in other areas or electrical engineering.

LIST OF REFERENCE SYMBOLS USED

1 Housing
2 Base housing part
3 Housing cover
4 Cover part
5 First hood
6 Second hood
7 Guides
8 Main printed circuit board
9 Insertion tab
10 Center longitudinal axis
11 Connection area
12 Extension area
13 First plug-in opening in 4
14 Second plug-in openings and in 5
15 side, front-side of the wall sections of 4
16 side, front-side of the wall section of 6
17 End face plug-in device
18 Extension circuit boards (subscriber)
19 Guides for 18
20 Convex curved front center surface
21 Twist locks
22 Support edge
23 First plug-in device
24 Second plug-in device
25 Cutout, keyhole-shaped
26 Recesses
27 Main printed circuit board surface
28 Extension printed circuit board (digital)

29 Latching spring on 2
30 Starting bevel
31 Arrow
32 Analog subscriber line termination
33 Digital subscriber line termination
36 Starting surfaces
37 Snap-in hooks of 6
38 Cutout in 4
39 Latching connection between 4 and 5

The invention claimed is:

1. A device for use in a communication system that comprises a housing, the housing comprising:
a connection area configured to be at least partially accessible from outside of the housing;
a housing cover comprised of a first hood and a cover portion, the first hood having at least one aperture and at least one attachment mechanism, the cover portion having at least one first guide and at least one clip connection mechanism sized and configured to releasably retain the at least one attachment mechanism of the first hood;
a base housing part; and
a printed circuit board arranged between the base housing part and the cover portion, the printed circuit board having an extension area, the extension area comprised of at least one first plug-in device sized and configured to connect to a first extension printed circuit board;
the at least one first plug-in device comprising a first plug-in device, the first plug-in device being mechanically connected to a first extension printed circuit board, the first extension circuit board at least partially supported on the at least one first guide attached to the cover portion;
the first extension circuit board having at least one second plug-in device that is positioned in the at least one aperture when the first hood is connected to the cover portion, the at least one second plug-in device of the first extension circuit board configured for connection of system terminations; and
the cover portion configured to releasably attach to the base housing part and configured to clamp at least a portion of the printed circuit board against the base housing part when the cover portion is attached to the base housing part; and
wherein the first hood is only releasable from the cover portion after the at least one attachment mechanism and at least one clip connection mechanism are interlocked by use of a mechanical tool to release the first hood from the cover portion.

2. The device according to claim 1, the housing further comprising a second hood adapted to be releasably connected to the cover portion, wherein the second hood covers the connection area when the second hood is connected to the cover portion; and
the at least one attachment mechanism comprised of at least one attachment tab that is insertable into and connected to the at least one clip connection mechanism to form a clip connection, the clip connection being unlockable and releasable by the use of the mechanical tool to unlock the first hood from the cover portion and release the first hood from the cover portion.

3. The device housing according to claim 2,
wherein the base housing part includes at least one second guide and a support edge,
wherein the at least one second guide guides the printed circuit board and the cover portion during assembly by being fit within a portion of the cover portion; and
wherein the printed circuit board is arranged between the support edge and the cover portion.

4. The device according to claim 3, wherein the at least one first plug-in device is comprised of a plurality of first plug-in devices and the at least one first extension circuit board is comprised of a plurality of first extension circuit boards, each of the first plug-in devices sized and configured to establish an electrical connection with a respective one of the first extension circuit boards.

5. The device according to claim 4, wherein the first hood and the second hood are each curved in a convex shape in a central area running concentrically to a center longitudinal axis.

6. The device according to claim 2, wherein at least one part selected from the group consisting of the cover portion, the first hood, and the second hood is manufactured by injection molding.

7. The device according to claim 6, wherein the mechanical tool is a screwdriver and wherein at least one of the cover portion, the first hood, and the second hood is manufactured from a polymer plastic.

8. The device according to claim 2 wherein a part selected from the group consisting of the cover portion, the first hood, and the second hood is manufactured from a polymer plastic.

9. The device according to claim 2 wherein the first hood and the second hood are each curved in a convex shape in a central area running concentrically to a center longitudinal axis.

10. The device according to claim 2 wherein the first hood and the second hood adjoin side wall sections of the cover portion in an assembled state.

11. The device according to claim 10, wherein the first hood, the second hood and the side wall sections form a continuous surface when interconnected to the cover portion.

12. The device of claim 2 wherein the second hood has at least one twist lock and at least one snap-in hook, each snap-in hook adjacent a respective twist lock and wherein the second hood is releasable from the cover portion without use of a mechanical tool.

13. The device of claim 12 wherein the at least one twist lock and at least one snap-in hook are configured to releasably attach to the cover portion when at least a portion of the at least one snap-in hook is inserted into at least one opening formed in the cover portion.

14. The device according to claim 1,
wherein the base housing part includes at least one second guide and a support edge,
wherein the at least one second guide guides the printed circuit board and the cover portion during assembly by being fit within a portion of the cover portion; and
wherein the printed circuit board is arranged between the support edge and the cover portion.

15. The device according to claim 1, wherein the at least one first plug-in device is sized and configured to establish an electrical connection with the at least one first extension printed circuit board.

16. The device according to claim 1, wherein the at least one aperture is arranged to face the connection area.

17. The device according to claim 16, wherein each aperture of the at least one aperture is a generally rectangular push through opening.

18. The device according to claim 1, wherein the base housing part has at least one keyhole-shaped cutout for wall mounting.

* * * * *